United States Patent
Amagai et al.

(10) Patent No.: US 6,297,076 B1
(45) Date of Patent: Oct. 2, 2001

(54) PROCESS FOR PREPARING A SEMICONDUCTOR WAFER

(75) Inventors: Masazumi Amagai, Ushiku; Kazuyoshi Ebe, Shiraoka-machi; Hideo Senoo, Wakou, all of (JP)

(73) Assignees: Lintec Corporation, Tokyo (JP); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 08/234,073

(22) Filed: Apr. 28, 1994

(30) Foreign Application Priority Data

Apr. 28, 1993 (JP) .................................................. 5-102761
Mar. 31, 1994 (JP) .................................................. 6-062610

(51) Int. Cl.$^7$ ........................... H01L 21/44; H01L 21/48; H01L 21/50
(52) U.S. Cl. ........................... 438/114; 438/118; 438/127
(58) Field of Search ........................... 428/345; 437/226, 437/227

(56) References Cited

U.S. PATENT DOCUMENTS

| | | | | |
|---|---|---|---|---|
| 4,296,542 | * | 10/1981 | Gutman | 29/574 |
| 4,756,968 | * | 7/1988 | Ebe et al. | 428/343 |
| 4,929,486 | * | 5/1990 | Itou et al. | 428/77 |
| 4,946,728 | * | 8/1990 | Ikeda et al. | 428/40 |
| 4,965,127 | * | 10/1990 | Ebe et al. | 428/343 |
| 4,994,300 | * | 2/1991 | Itou et al. | 427/54.1 |
| 4,999,242 | * | 3/1991 | Ishiwata et al. | 428/345 |
| 5,110,388 | * | 5/1992 | Komiyama et al. | 156/229 |
| 5,118,567 | * | 6/1992 | Komiyama et al. | 428/345 |
| 5,149,586 | * | 9/1992 | Ishiwata et al. | 428/345 |
| 5,187,007 | * | 2/1993 | Ebe et al. | 428/343 |
| 5,281,473 | * | 1/1994 | Ishiwata et al. | 428/345 |
| 5,356,949 | * | 10/1994 | Komiyama et al. | 522/102 |

* cited by examiner

*Primary Examiner*—David E. Graybill

(57) ABSTRACT

Disclosed is a process for preparing a semiconductor device comprising the steps of adhering a back surface of a wafer, a front surface of which has been formed a circuit, onto the radiation curable adhesive layer, dicing the wafer into chips, rinsing, drying, irradiating the adhesive layer with radiation to cure said adhesive layer, expanding the adhesive sheet if necessary to make the chips apart from each other, then picking up the chips, mounting the picked chips on a lead frame, bonding, and molding to give such a structure that the back surfaces of the chips are partially or wholly in contact with a package molding resin, wherein the radiation curable adhesive layer comprises 100 parts by weight of an acrylic adhesive composed of a copolymer of an acrylic ester and an OH group-containing polymerizable monomer and 50–200 parts by weight of a radiation polymerizable compound having two or more unsaturated bonds, and the radiation curable adhesive layer has an elastic modulus of not less than $1 \times 10^9$ dyn/cm$^2$ after curing by irradiation with radiation.

13 Claims, 2 Drawing Sheets

PROCESS FOR PREPARING A SEMICONDUCTOR WAFER

FIELD OF THE INVENTION

The present invention relates to an adhesive sheet for a semiconductor wafer (referred to as "wafer" hereinafter) and a process for preparing a semiconductor device using this adhesive sheet. More particularly, the invention relates to an adhesive sheet which is used for applying and fixing thereon a wafer having been subjected to wafer processing in order to dice the wafer into element chips (referred to as "chips" hereinafter) in a process for preparing a semiconductor device having such a structure that the back surfaces of the chips are partially or wholly in contact with a package molding resin (sealing resin), and the invention also relates to a process for preparing a semiconductor device using this adhesive sheet.

BACKGROUND OF THE INVENTION

With higher integration of memories, there have recently been made a variety of requests to semiconductor device by users, for example, high speed response, reduction of electric power consumption, widening of output word structure and enlargement of package variation. For coping with these various requests, package designing should be made flexibly.

In order to satisfy the above-mentioned requests, semiconductor devices of LOC (Lead On Chip) structure have been proposed, as described in for example "Nikkei Microdevices" (pp. 89–97, February, 1991) and Japanese Patent Laid-Open Publication No. 246125/1990. The LOC structure has various advantages such as minimized size, high speed response, reduced noise and easy layout, and hence it is said that the LOC structure is most strikingly adopted to large-scale semiconductor devices which are expected to be developed in future.

In the LOC structure, as shown in FIG. 7, plural inner leads of a semiconductor device lead frame (referred to as "lead frame" hereinafter) are fixed onto a surface of a chip, on which a circuit has been formed, by way of insulating tapes which electrically insulate the inner leads from the chip, and the inner leads are electrically connected with the chip by a bonding wire. The semiconductor device is sealed with a molding resin, and the back surface of the chip is in contact with the molding resin.

The LOC structure has various advantages as described above, but this structure involves problems which must be solved because it is entirely different from structures of conventional packages. One of problems which must be solved is lowering of reliability caused by separation between the chips and the molding resin, occurrence of package cracks, etc.

The lowering of reliability caused by occurrence of package cracks, etc. is not an inherent problem in the semiconductor device having the LOC structure, and it is a very serious problem to all the semiconductor devices having such structures as shown in FIGS. 8 to 9 wherein the back surface of the chip is partially or wholly in contact with the molding resin. FIG. 8 shows a semiconductor device having such a structure that a die pad has a slit. FIG. 9 shows a semiconductor device having a COL (Chip On Lead) structure.

The mechanism of the separation between the chips and the molding resin or the occurrence of package cracks has been diversely reported so far.

One of the mechanism of these phenomena is an invasion of moisture into the IC package.

The invasion routes of moisture into the IC package are broadly classified as follows:

(1) invasion through interface between the lead frame and the resin,
(2) invasion through interface between the resin and a filler filled in the resin, and
(3) invasion through the resin bulk.

These invasions are caused by capillarity or diffusion, and as the environmental temperature or humidity at which the IC package is left rises, the IC package absorbs moisture more easily. Further, as the environmental temperature rises, the moisture diffusion rate at the initial stage becomes higher and the moisture absorption reaches its saturation point more rapidly. For example, there is a report that when the IC package is allowed to stand at 85° C. and 85% RH (RH: relative humidity) and to absorb moisture, the moisture absorption reaches 80 to 90% of its saturation point in about 168 hours. Moreover, even in an ordinary atmosphere of an ordinary temperature and 75% RH, moisture easily permeates the molding resin material of the IC package, for example, an epoxy resin.

In the IC package such as SOJ or QFP, soldering is conducted generally by means of IR reflowing in which heating is effected by infrared rays or vapor reflowing in which an inert liquid is vaporized and the IC package is exposed to the vapor of high temperature since both reflowing methods are suitable for mass production. In the IR reflowing, the former method, the IC package is exposed to a high temperature of 240 to 250° C., whereby the moisture which has invaded inside of the IC package as described above is explosively expanded by the high temperature during the reflowing operation, and thereby water vapor pressure is applied onto the interface between the epoxy resin and the lead frame to bring about interfacial separation therebetween. As a result, package cracks take place.

The package cracks caused by the IR reflowing are often observed even when the package is allowed to stand at an ordinary temperature for about 168 hours, though it depends on the shape of the lead frame in the package, the surface area of the chips, etc.

One reason for promoting the interfacial separation is a decrease of adhesion strength between the resin material used for sealing the package, for example, an epoxy resin, and the contact surface of the chip. The adhesion strength is largely influenced by cleanliness of the adherend surface. For example, the adhesion strength is very sensitive even to a foreign substance having an angstrom level thickness remaining on the adherend surface so as to decrease the adhesion strength, whereby invasion of moisture or retention thereof within the package is easily made, and finally the package cracks are brought about.

By the way, semiconductor wafers of silicon, gallium-arsenide, etc. are usually produced in relatively large diameter, and the wafers are diced into chips, which are then transferred to the subsequent mounting stage. At this time, the semiconductor wafers are subjected to such operations as dicing, rinsing, drying and irradiation of radiation rays to cure the radiation curing adhesive layer of an adhesive sheet in a state that the semiconductor wafers are adhered to the adhesive sheet. Then, an expansion operation of the adhesive sheet is carried out if necessary, and thereafter operations of picking up the chips and mounting the chips are carried out.

Adhesive sheets which are intended for use in the processing stages of wafers, from the dicing stage up to the pick-up stage, are desired to have an adhesion force sufficient to retain wafers and/or chips thereon in the course from the dicing stage up to the expanding stage, but in the pick-up stage, they are desired to only retain an adhesion force of such an extent that no adhesive remains on the picked-up wafer chips. As such adhesive sheets for applying wafers thereon as mentioned above, those described in for example Japanese Patent Publication No. 56112/1989 have been generally used, and they can be used without any problem in preparing semiconductor devices of conventional type.

However, in the preparation of semiconductor devices having such a structure that the back surfaces of the chips are partially or wholly in contact with the molding resin, a trouble of package crack occurrence is observed and the reliability of the semiconductor device is reduced.

OBJECT OF THE INVENTION

The present invention has been made in the light of the foregoing techniques in the prior art, and it is an object of the present invention to provide an adhesive sheet for wafer (referred to as "adhesive sheet for wafer" hereinafter) which is used in preparing a semiconductor device having such a structure that the back surfaces of chips are partially or wholly in contact with a molding resin and which can prevent occurrence of package cracks thereby to enhance reliability of the semiconductor device. It is another object of the present invention to provide a process for preparing a semiconductor device using this adhesive sheet.

SUMMARY OF THE INVENTION

The adhesive sheet for wafer according to the present invention is an adhesive sheet comprising a substrate film and a radiation curable adhesive layer formed thereon, said adhesive sheet being used in a process for preparing a semiconductor device comprising the steps of adhering a back surface of a wafer, a front surface of which has been formed a circuit, onto the radiation curable adhesive layer, dicing the wafer into chips, irradiating the radiation curable adhesive layer with radiation to cure said adhesive layer, expanding the adhesive sheet if necessary to make the chips apart from each other, then picking up the chips, mounting the chips on a lead frame, bonding, and molding (sealing) to give such a structure that the back surfaces of the chips are partially or wholly in contact with a package molding resin, wherein the radiation curable adhesive layer comprises
100 parts by weight of an acrylic adhesive composed of a copolymer of an acrylic ester and an OH group-containing polymerizable monomer and
50–200 parts by weight of a radiation polymerizable compound having two or more unsaturated bonds, and
the radiation curable adhesive layer has an elastic modulus of not less than $1\times10^9$ dyn/cm$^2$ after curing by irradiation with radiation.

The process for preparing a semiconductor device according to the present invention uses an adhesive sheet for wafer comprising a substrate film and a radiation curable adhesive layer provided thereon which comprises 100 parts by weight of an acrylic adhesive composed of a copolymer of an acrylic ester and an OH group-containing polymerizable monomer and 50–200 parts by weight of a radiation polymerizable compound having two or more unsaturated bonds and has an elastic modulus of not less than $1\times10^9$ dyn/cm$^2$ after curing by irradiation with radiation, and the process comprises the steps of adhering a back surface of a wafer, a front surface of which has been formed a circuit, onto the radiation curable adhesive layer, dicing the wafer into chips, irradiating the radiation curable adhesive layer with radiation to cure said adhesive layer, expanding the adhesive sheet if necessary to make the chips apart from each other, then picking up the chips, mounting the chips on a lead frame, bonding, and molding (sealing) to give such a structure that the back surfaces of the chips are partially or wholly in contact with a package molding resin.

In the present invention, it is preferred that 20 to 80% by weight of a radiation polymerizable compound having two or more unsaturated bonds are those having four or more unsaturated bonds.

DETAILED DESCRIPTION OF THE INVENTION

The adhesive sheet for wafer and the process for preparing a semiconductor device using the adhesive sheet according to the present invention are described in detail hereinafter.

As shown in FIGS. 1 to 6, the adhesive sheet for wafer 1 of the present invention comprises a substrate film 2 and a radiation curable adhesive layer 3 provided thereon. The adhesive sheet 1 is used in preparing a semiconductor device having such a structure that the back surfaces of chips are partially or wholly in contact with a molding resin. This process comprises the steps of adhering a wafer A which has been subjected to wafer processing onto the radiation curable adhesive layer 3, dicing the wafer in this state into plural chips, rinsing, drying, irradiating the radiation curable adhesive layer 3 of the adhesive sheet 1 with radiation to cure the adhesive layer so as to decrease the adhesion force of the layer, expanding the adhesive sheet if necessary to make the chips apart from each other, then picking up the chips from the radiation curable adhesive layer 3, mounting the picked chips on a given support substrate, for example, a lead frame, and finally molding with a resin.

Figure 1:
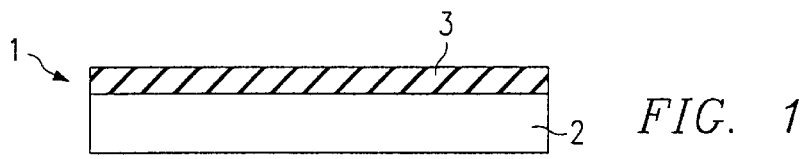
FIG. 1 is a schematic sectional view of an adhesive sheet for wafer according to the present invention.
Figure 2:
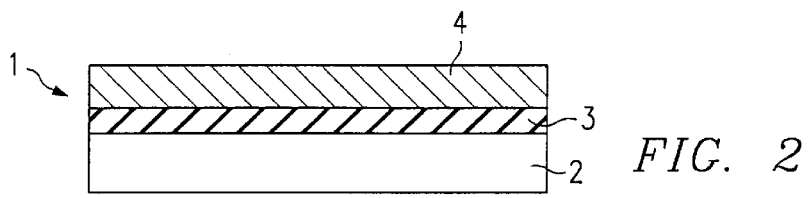
FIG. 2 is a schematic sectional view of another adhesive sheet for wafer according to the present invention.

As can be seen from its sectional view shown in FIG. 1, the adhesive sheet for wafer 1 of the invention comprises the substrate film 2 and the radiation curable adhesive layer 3 provided on the surface of the substrate film. Before the use of this adhesive sheet, it is preferred to temporarily apply a release sheet 4 onto the radiation curable adhesive layer 3 to protect the adhesive layer 3, as shown in FIG. 2.

The adhesive sheet for wafer 1 of the invention may be shaped into any form such as tape-like, label-like or other form. Suitable as the substrate film 2 are materials which are excellent in water resistance and heat resistance, and on this view, synthetic resin films are particularly suitable. As will be stated later, the adhesive sheet for wafer of the invention is irradiated with radiation such as electron beam (EB) or ultraviolet light (UV), and the substrate film 2 is not required to be transparent when the adhesive sheet is subjected to EB irradiation but must be transparent even though colored when the adhesive sheet is subjected to UV irradiation.

Employable as the substrate film 2 are films of synthetic resins such as polyethylene, polypropylene, polyvinyl chloride, polyethylene terephthalate, polybutylene terephthalate, polybutene, polybutadiene, polyurethane, polymethylpentene, ethylene/vinyl acetate copolymer, ethylene/(meth)acrylic acid copolymer, ethylene/methyl (meth)acrylate copolymer, ethylene/ethyl (meth)acrylate copolymer, etc. A laminate of these films is also employable. The thickness of the substrate film 2 is usually in the range of about 10 to 300 $\mu$m, preferably 50 to 200 $\mu$m.

In the case where the adhesive sheet needs to be subjected to an expansion treatment after the dicing of wafer, a synthetic resin film having extensibility in the lengthwise direction and the crosswise direction, such as a film of polyvinyl chloride or a film of polyethylene conventionally used, is preferably used as the substrate film.

The adhesive sheet for wafer 1 of the present invention comprises the substrate film 2 described above and a radiation curable adhesive layer 3 formed on the substrate film 2. The radiation curable adhesive layer 3 has an elastic modulus of not less than $1 \times 10^9$ dyn/cm$^2$, preferably $1 \times 10^9$ to $1 \times 10^{10}$ dyn/cm$^2$, after curing by irradiation with radiation.

The elastic modulus mentioned herein is determined in the following manner. That is, a small specimen of an adhesive which forms the adhesive layer 3 having a length of 50 mm, a width of 4 mm and a thickness of 0.2 mm is prepared. The specimen is placed under a high-pressure mercury lamp of 80 W/cm and irradiated with radiation for 1 second to cure it. After curing, the specimen is measured on the elastic modulus at 3.5 Hz by means of a viscoelasticity measuring device such as "(Rheovibron DDV-II-EP", produced by Orientic K.K.) to obtain a graph of elastic modulus, and from the graph a value at 25° C. is sought as the elastic modulus of the adhesive layer.

The radiation curable adhesive layer 3 formed on the substrate film 2 comprises an adhesive and a radiation polymerizable compound. Suitable as the adhesive are acrylic adhesives composed of a copolymer of an acrylic ester and an OH group-containing polymerizable monomer. The acrylic adhesives are copolymers containing repeating units derived from acrylic esters and repeating units derived from OH group-containing polymerizable monomers as its principal constituent units. The OH group-containing polymerizable monomer units are contained in the copolymer in an amount of 0.5 to 30% by mol, preferably 8 to 30% by mol, more preferably 20 to 30% by mol.

Examples of the acrylic esters suitably used include acrylic esters of alkyl alcohols having 1 to 10 carbon atoms and methacrylic esters of alkyl alcohols having 1 to 10 carbon atoms.

Examples of the OH group-containing monomers suitably used include 2-hydroxyethyl acrylate, 2-hydroxyethyl methacrylate, hydroxypropyl acrylate and hydroxypropyl methacrylate. Of these, 2-hydroxyethyl acrylate and 2-hydroxyethyl methacrylate are preferred.

The copolymer obtained by copolymerizing these monomers has a molecular weight of $1.0 \times 10^5$ to $10.0 \times 10^5$, preferably $4.0 \times 10^5$ to $8.0 \times 10^5$.

In addition to the above-mentioned constituent units, the acrylic adhesives may contain other constituent units such as those derived from vinyl acetate, acrylonitrile, vinyl alkyl ether, etc., provided that the object of the present invention is not marred.

The adhesion force and the cohesion force of the acrylic adhesives can be optionally determined by the use of a crosslinking agent. Examples of the crosslinking agents include polyvalent isocyanate compounds, polyvalent epoxy compounds, polyvalent aziridine compounds and chelate compounds. Concrete examples of the polyvalent isocyanate compounds include tolylene diisocyanate, diphenylmethane diisocyanate, hexamethylene diisocyanate, isophorone diisocyanate and adducts thereof. Concrete examples of the polyvalent epoxy compounds include ethylene glycol diglycidyl ether and diglycidyl terephthalate. Concrete examples of the polyvalent aziridine compounds include tris-2,4,6-(1-aziridinyl)-1,3,5-triazine, tris[1-(2-methyl)-aziridinyl]phosphine oxide and hexa[1-(2-methyl)-aziridinyl]triphosphatriazine. Concrete examples of the chelate compounds include ethyl acetoacetate aluminum diisopropylate and aluminum tris(ethylacetoacetate).

As the radiation polymerizable compound for the radiation curable adhesive layer 3, there can be widely used low-molecular weight compounds having at least two photopolymerizable carbon-carbon double bonds in the molecule capable of forming a three-dimensional network upon light irradiation, as described in for example Japanese Patent Laid-Open Publications No. 196956/1985 and No. 223139/1985. Concrete examples of such low-molecular weight compounds include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

In addition to the acrylate compounds as mentioned above, urethane acrylate oligomers are also employable as the radiation polymerizable compound. The urethane acrylate oligomers may be prepared by reacting polyester or polyether type polyol compounds with polyvalent isocyanate compounds, for example, 2,4-tolylene diisocyante, 2,6-tolylene diisocyante, 1,3-xylene diisocyanate, 1,4-xylylene diisocyanate and diphenylmethane-4,4-diisocyanate, to obtain isocyanate urethane prepolymers which are then reacted with acrylates or methacylates having a hydroxyl group, for example, 2-hydroxyethyl acrylate, 2-hydroxyethyl methacrylate, 2-hydroxypropyl acrylate, 2-hydroxypropyl methacrylate, polyethylene glycol acrylate and polyethylene glycol methacrylate.

Of such urethane acrylate oligomers, those having a molecular weight of 3,000 to 30,000, preferably 3,000 to 10,000, more preferably 4,000 to 8,000, are particularly preferably used because the adhesive containing these urethane acrylate oligomers does not adhere to the back surface of the chips in the pick-up stage of the chips even if the back surface of the wafer is rough. Further, the urethane acrylate oligomers preferably have at least two carbon-carbon double bonds, more preferably two carbon-carbon double bonds (namely 2-functional). Furthermore, in the case of using the urethane acrylate oligomers as the radiation polymerizable compound, there can be obtained an extremely excellent adhesive sheet, as compared with the case of using only the low-molecular weight compound having at least two photopolymerizable carbon-carbon double bonds in the molecule as disclosed in Japanese Patent Laid-Open Publication No. 196956/1985. In other words, the obtained adhesive sheet has a sufficiently high adhesion force before irradiation with radiation, but after the irradiation the adhesion force of the sheet decreases to such a level that no adhesive remains on the back surfaces of the chips in the pick-up stage of the chips.

In the present invention, it is preferred to use a plurality of the radiation polymerizable compounds in combination. For example, it is desirable that about 20 to 80% by weight, preferably about 30 to 70% by weight of a radiation polymerizable compound having two or more unsaturated bonds are those having four or more unsaturated bonds. Concrete examples of the radiation polymerizable compound having four or more unsaturated bonds include pentaerythritol tetraacrylate,
1,6-bis(glyceryl urethane)hexane tetramethacrylate (1),

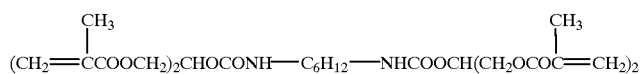

(1)

bis(glyceryl urethane)isophorone tetramethacrylate (2), and

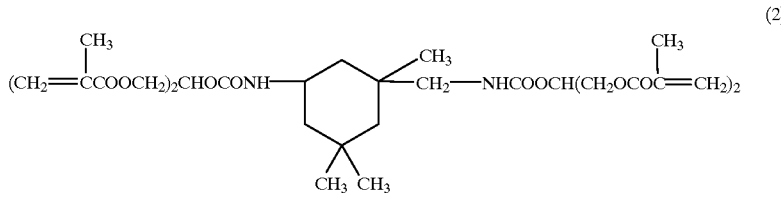

bis(glyceryl urethane)toluene tetramethacrylate (3).

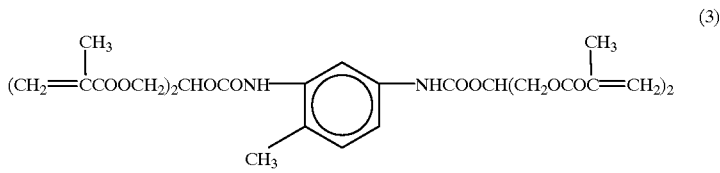

When such radiation polymerizable compound having four or more unsaturated bonds is used in an amount of 20 to 80% by weight based on 100% of the radiation polymerizable compound, the radiation curable adhesive layer is sufficiently cured by irradiation with radiation and the cohesion force of the adhesive does not decrease.

Further, it is particularly preferred that the radiation polymerizable compounds having two or more unsaturated bonds are used in combination with each other wherein 20 to 80% by weight, preferably 30 to 70% by weight of those having four or more unsaturated bonds and 20 to 60% by weight, preferably 30 to 50% by weight of those having six or more unsaturated bonds are present in the total amount of the radiation polymerizable compounds having two or more unsaturated bonds. Concrete examples of the radiation polymerizable compound having six or more unsaturated bonds include dipentaerythritol hexaacrylate,
dipentaerythritol hexamethacrylate,
1,6-bis(pentaerythritol urethane)hexane hexaacrylate (4),

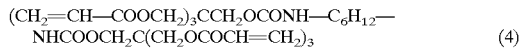            (4)

bis(pentaerythritol urethane)isophorone hexaacrylate (5), and

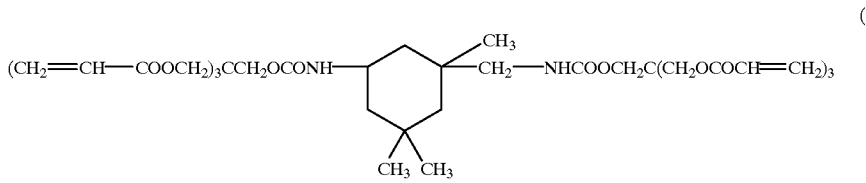

bis(pentaerythritol urethane)toluene hexaacrylate (6).

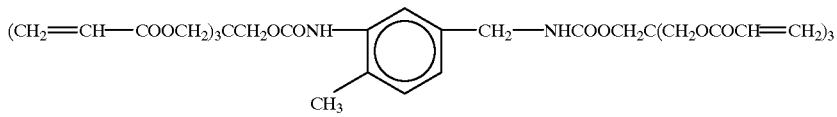

(6)

Examples of combinations of the radiation polymerizable compounds particularly preferably used are given below, but combinations employable in the present invention are in no way limited to those examples.

1. A combination of 2-functional urethane acrylate oligomer and pentaerythritol tetraacrylate which is 4-functional.
2. A combination of 2-functional urethane acrylate oligomer and dipentaerythritol hexaacrylate which is 6-functional.
3. A combination of 2-functional urethane acrylate oligomer and bis(petnaerythritol urethane)hexane hexaacrylate.

With respect to the proportion between the acrylic adhesive and the radiation polymerizable compound in the adhesive layer, the radiation polymerizable compound is used usually in an amount of 50 to 200 parts by weight, preferably 50 to 150 parts by weight, particularly preferably 70 to 120 parts by weight, based on 100 parts by weight of the acrylic adhesive. The adhesive sheet containing the acrylic adhesive and the radiation polymerizable compound in such proportions has high initial adhesion force, and moreover, the initial adhesion force greatly decreases after irradiation with radiation and hence the chips can readily be picked up from the adhesive sheet.

If the amount of the radiation polymerizable compound is less than 50 parts by weight, a large amount of the adhesive may adhere to the back surfaces of the chips after the compound is cured by irradiation with radiation, whereby package crackings occur when the package is sealed with a resin. On the other hand, if the amount of the radiation polymerizable compound is larger than 200 parts by weight, the cohesion force of the adhesive lowers to induce another problem (i.e., separation of the adhesive sheet from the frame), though occurrence of the package crack can be inhibited.

The adhesive sheet for wafer 1 comprising the substrate film 2 and the radiation curable adhesive layer 3 as described above has a sufficient adhesion force to the adherend before irradiation with radiation but is markedly decreased in the adhesion force after the irradiation with radiation. More specifically, before irradiation with radiation, the adhesive sheet has an adhesion force of, for example, not less than 200 g/25 mm to a stainless steel having been subjected to mirror surface treatment, but the adhesion force decreases to not more than 20 g/25 mm after irradiation with radiation.

The radiation curable adhesive layer 3 may contain, if necessary, a radiation color developable compound (compound which develops color upon irradiation), in addition to the above-mentioned adhesive and radiation polymerizable compound. By virtue of incorporating the radiation color developable compound into the radiation curable adhesive layer 3, the adhesive sheet is colored after irradiated with radiation, whereby the detection accuracy is enhanced at the time of detecting chips by means of a photosensor and a possible failure in operation to pick up the chips is prevented. Further, there can be obtained such an advantage that whether the adhesive sheet has been irradiated with radiation or not can be immediately confirmed visually.

The radiation color developable compounds are compounds which are colorless or pale-colored before irradiation but develop color upon irradiation, and preferred examples of such compounds are leuco dyes. Preferably employable as the leuco dyes are those conventionally used, such as triphenylmethane type, fluoran type, phenothiazine type, auramine type and spiropyrane type dyes. Concrete examples of these dyes include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenylmethanol and 4,4',4"-trisdimethylaminotriphenylmethane.

Developers preferably used in combination with the above-mentioned leuco dyes are those conventionally used, such as initial polymers of phenol-formalin resin, aromatic carboxylic acid derivatives and electron acceptors, e.g., activated clay. In order to change the color tone, various known color formers can also be used in combination therewith.

The radiation color developable compound may be incorporated into the radiation curable adhesive layer in the form of a solution in an organic solvent or in the form of fine particles. The amount of the compound to be incorporated into the radiation curable adhesive layer is usually in the range of 0.01 to 10% by weight, preferably 0.5 to 5% by weight. If the amount thereof exceeds 10% by weight, the radiation with which the adhesive sheet is irradiated is too much absorbed by the compound, and hence the radiation curing adhesive layer sometimes is cured insufficiently. On the other hand, if the amount of the compound is less than 0.01% by weight, the adhesive sheet is not sufficiently colored at the time of irradiation, and hence a failure in operation to pick up the chips easily occurs.

Under certain circumstances, the radiation curable adhesive layer 3 may contain a powder of a light scattering inorganic compound, in addition to the aforementioned adhesive and radiation polymerizable compound. By virtue of incorporating the light scattering inorganic compound powder into the radiation curable adhesive layer 3, even when an adherend surface of a wafer has been greyed or blackened for some reason or other, the adhesion force of the adhesive layer sufficiently decreases even at the portions corresponding to the greyed or blackened portions of the wafer surface by irradiation of radiation such as ultraviolet light, and hence no adhesive remains on the back surfaces of the chips during the pick-up stage of the chips, while the adhesive layer has a sufficient adhesion force before irradiation.

The light scattering inorganic compounds referred to above are such compounds as capable of irregularly reflecting radiation such as ultraviolet light (UV) or electron beam (EB) when the compounds are irradiated with such radiation. Concrete examples of the light scattering inorganic compound powder include silica powder, alumina powder, silica alumina powder, and mica powder. As the light scattering inorganic compounds, those which almost perfectly reflect such radiation as mentioned above are preferably employed, but those which absorb the radiation to a certain extent are also employable.

The light scattering inorganic compound preferably is in the form of powder, and has a particle diameter of 1 to 100 $\mu$m, preferably about 1 to 20 $\mu$m. In the radiation curable adhesive layer, the light scattering inorganic compound is desirably used in an amount of 0.1 to 10% by weight, preferably 1 to 4% by weight. If the light scattering inorganic compound is used in the radiation curable adhesive layer in an amount exceeding 10% by weight, the adhesion force of the radiation curable adhesive layer sometimes decreases. On the other hand, if this compound is used in an amount less than 0.1% by weight, the adhesive layer is not sufficiently decreased in the adhesion force after irradiation in the portions of the adhesive layer corresponding to the greyed or blackened portions of the wafer surface, and hence, the adhesive may adhere to and remain on the back surfaces of the chips in the pick-up stage of the chips.

As stated above, by the use of the adhesive sheet comprising the radiation curable adhesive layer which contains the light scattering inorganic compound powder, even when the adherend surface of the wafer has been greyed or blackened for some reason or other, the adhesion force. of the adhesive layer sufficiently decreases even at the portions corresponding to the greyed or blackened portions of the wafer surface by irradiation with radiation. The reason for this is considered to be as follows. That is, the adhesive sheet 1 of the present invention has the radiation curable adhesive layer 3, and when this radiation curable adhesive layer 3 is irradiated with radiation, the radiation polymerizable compound contained in the adhesive layer 3 is cured to decrease the adhesion force of the adhesive layer. However, the wafer surface sometimes has portions greyed or blackened for some reason or other. When the radiation curable adhesive layer 3 is irradiated with radiation, the radiation passes through the radiation curable adhesion layer 3 to reach the wafer surface. However, if the wafer surface has greyed or blackened portions, the radiation is absorbed by those portions and is not reflected. Therefore, the radiation which is to be utilized to cure the radiation curable adhesive layer 3 is absorbed by the portions corresponding to the greyed or blackened portions of the wafer surface, and hence the curing of the radiation curable adhesive layer 3 becomes insufficient and the adhesion force of the adhesive layer does not sufficiently decrease. Accordingly, it is considered that the adhesive adheres to and remains on the back surfaces of the chips in the pick-up stage of the chips.

However, when the light scattering inorganic compound powder is incorporated into the radiation curable adhesive layer 3, the radiation is irregularly reflected by the compound and is altered in its direction before reaching the wafer surface. On that account, even if greyed or blackened portions are present on the wafer surface, the irregularly reflected radiation sufficiently permeates into the upper region of portions of the adhesive layer corresponding to the greyed or blackened portions of the wafer surface and accordingly the corresponding portions of the adhesive layer are cured sufficiently. By virtue of incorporation of the light scattering inorganic compound powder into the radiation curable adhesive layer, even when greyed or blacked portions are present on the wafer surface for some reason or other, the curing of the adhesive layer does not become insufficient at its portions corresponding to the greyed or blackened portions of the wafer surface and accordingly no adhesive adheres to and remains on the back surfaces of the chips in the pick-up stage of the chips.

In the present invention, abrasive grains may be dispersed in the substrate film. The abrasive grains have a grain diameter of 0.5 to 100 $\mu$m, preferably 1 to 50 $\mu$m, and a Mohs hardness of 6 to 10, preferably 7 to 10. Concrete examples of the abrasive grains include green carborundum, artificial corundum, optical emery, white alundum, boron carbide, chromium(III) oxide, cerium oxide and diamond powder. These abrasive grains preferably are colorless or white-colored. The abrasive grains are used in an amount of 0.5 to 70% by weight, preferably 5 to 50% by weight, in the substrate film 2. Use of the abrasive grains is particularly preferred when a dicing blade is used in such a manner that the blade reaches up to the substrate film 2 passing through the wafer.

By incorporating the abrasive grains into the substrate film, even if the dicing blade comes into the substrate film and the adhesive sticks to the blade, the adhesive can be easily removed owing to the abrasion effect of the abrasive grains.

Further, the above-mentioned adhesive layer may contain an UV curing initiator when the adhesive layer is cured by UV irradiation, in order to shorten the polymerization curing time by UV irradiation and to minimize the UV irradiation dose.

Concrete examples of such UV curing initiators include benzoin, benzoin methyl ether, benzoin ethyl ether, benzoin isopropyl ether, benzyldiphenyl sulfide, tetramethylthiuram monosulfide, azobisisobutyronitrile, dibenzyl, diacetyl and $\beta$-chloroanthraquinone.

In the process for preparing a semiconductor device according to the present invention, onto the adhesive sheet for wafer as mentioned above is applied a semiconductor wafer which has been subjected to wafer processing, then the wafer is diced in this state into chips, from which a semiconductor device is prepared.

The process for preparing a semiconductor device using the above-mentioned adhesive sheet for wafer according to the present invention is illustrated below.

Figure 3:
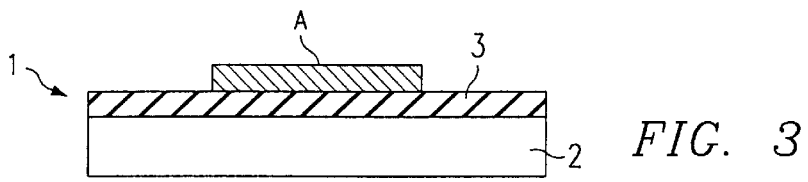
FIG. 3 is an illustration showing a state where a wafer is applied onto an adhesive sheet for wafer.

In the case where a release sheet 4 is provided on the adhesive sheet 1 as shown in FIG. 2, the release sheet 4 is first removed, and the adhesive sheet 1 is placed so that the radiation curable adhesive layer 3 looks upward. Onto the surface of the radiation curable adhesive layer 3, a wafer A which is to be diced is applied, as shown in FIG. 3. The wafer A is then subjected in this state to operations of dicing, and if necessary, rinsing and drying. In that case, the wafer chips will not fall off from the adhesive sheet 1 during each operation of dicing, rinsing and drying because the wafer chips are sufficiently adhered to and held on the adhesive sheet 1 by means of the radiation curable adhesive layer 3.

Figure 4:
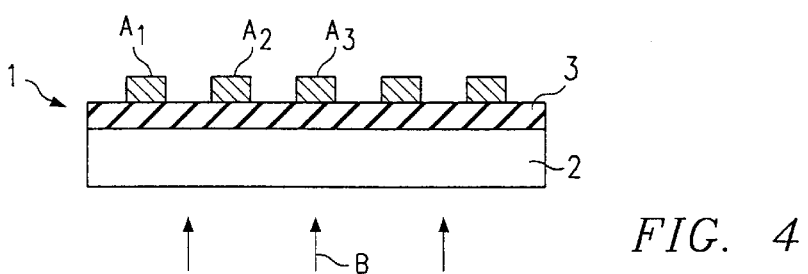
FIG. 4 is an illustration showing a state where a wafer is diced into chips, an adhesive sheet is expanded and the sheet is irradiated with radiation.

Subsequently, the wafer chips are picked up from the adhesive sheet and mounted on a support substrate, for example, a lead frame. As shown in FIG. 4, prior to or simultaneously with the pick-up operation, the radiation curable adhesive layer 3 of the adhesive sheet 1 is irradiated with an ionizing radiation B such as ultraviolet light (UV) or electron beam (EB) to polymerize and cure the radiation polymerizable compound contained in the radiation curable adhesive layer 3. When the radiation polymerizable compound contained in the radiation curable adhesive layer 3 is polymerized and cured by irradiating the adhesive layer 3 with radiation, the adhesion force of the adhesive contained in the adhesive layer greatly decreases, leaving only a slight adhesion force.

The irradiation to the adhesive sheet 1 is preferably effected from the free side of the substrate film 2 on which the radiation curable adhesive layer 3 is not provided. Accordingly, as mentioned previously, the substrate film 2 requires having light transmission properties when UV is used as the radiation, but the substrate film 2 does not always require having light transmission properties when EB is used as the radiation.

Figure 5:
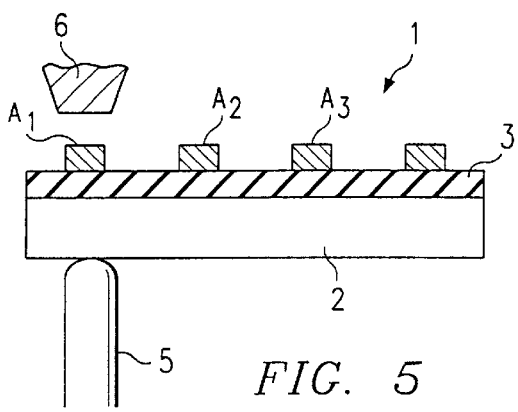
FIG. 5 is an illustration showing another pick-up stage of chips.

In the manner now described, the radiation curable adhesive layer 3 on which the wafer chips $A_1, A_2$ ... are provided are irradiated with radiation to decrease the adhesion force of the radiation curable adhesive layer 3, followed by expanding the adhesive sheet in a predetermined ratio, if necessary. By the expansion of the adhesive sheet, distances between the chips are widened, whereby the chips can be easily picked up from the adhesive sheet. Subsequent procedures can be effected according to a conventional manner. As shown in FIG. 5, each of the chips $A_1, A_2$ ... to be picked up is pushed up from the lower side of the substrate film 2 by means of a pushing rod 5, picked up by means of, for example, a suction collet 6, and then mounted on a support substrate, for example, a lead frame. By picking up the wafer chips $A_1, A_2$ ... in this manner, the chips can be easily picked up, and the obtained chips are of good quality without any contamination. The irradiation with radiation may also be conducted at a pick-up station.

Figure 6:
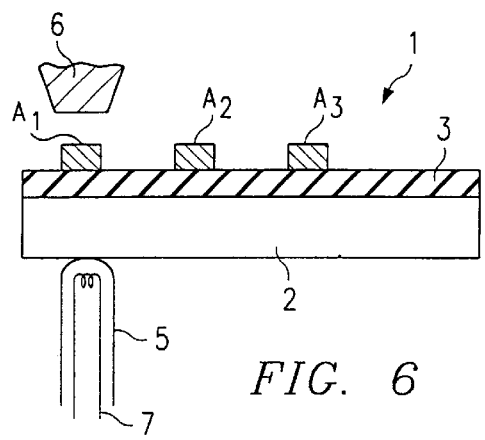
FIG. 6 is an illustration showing another pick-up stage of chips.

It is not always necessary to effect the irradiation at once on the whole surface of the wafer A, and it may be effected partially in several times, for example, only the portion of the substrate film corresponding to each of the wafer chips $A_1, A_2$ ... is irradiated from the back side surface of the substrate film 2 by means of an irradiating tube to decrease the adhesion force of the adhesive corresponding to the irradiated portion, and then the wafer chips $A_1, A_2$ ... may successively be pushed up by means of the pushing rod 5, followed by picking up each of the pushed-up chips. FIG. 6 shows a modification of the above-mentioned irradiation method, wherein the pushing rod 5 is hollow and a radiation source 7 is provided in the hollow portion of the pushing rod so that the irradiation operation and the pick-up operation can be effected at the same time, thus the apparatus can be simplified and moreover the time required for the pick-up operation can be shortened.

Figure 7:
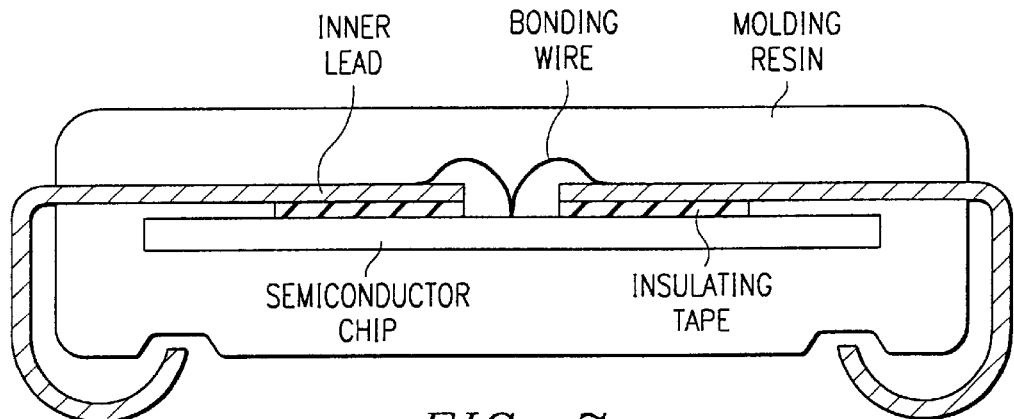
FIG. 7 is a sectional view of a semiconductor device having a LOC structure.
Figure 8:
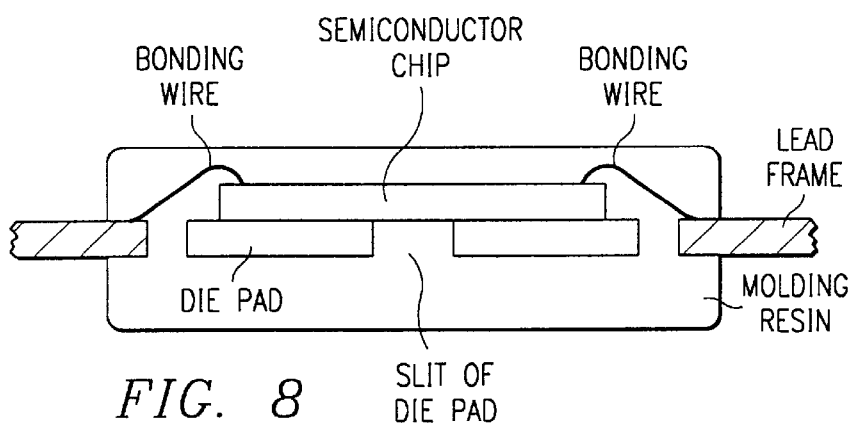
FIG. 8 is a sectional view of a semiconductor device having such a structure that a die pad has a slit.
Figure 9:
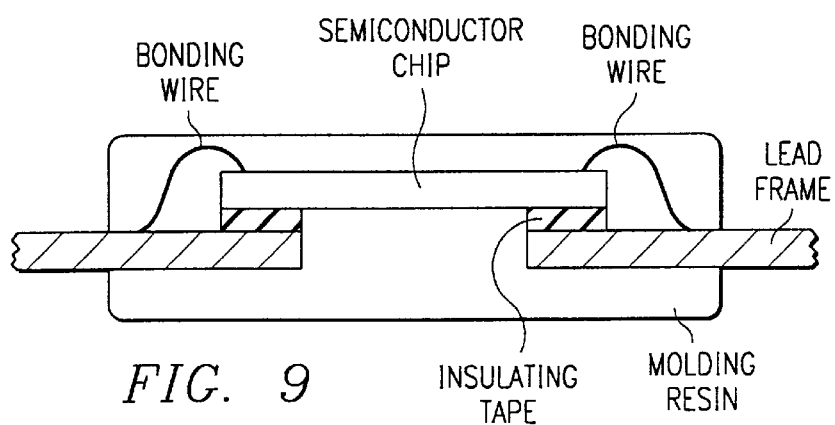
FIG. 9 is a sectional view of a semiconductor device having a COL (Chip On Lead) structure.

In the process for preparing a semiconductor device according to the present invention, the chips obtained as above are mounted on a given support substrate such as a lead frame and then subjected to bonding operation and sealing operation with a molding resin according to a conventional manner. The thus prepared semiconductor device may have such a structure that the back surfaces of the chips are partially or wholly in contact with the molding resin as shown in FIGS. 7 to 9. According to the process of the present invention, a semiconductor device free from occurrence of package cracks can be obtained, and hence the reliability can be enhanced.

As the molding resin used herein, preferred are resin compositions containing cresol novolak type epoxy resin, naphthalene type epoxy resin, biphenyl type epoxy resin or aromatic polyfunctional type epoxy resin as a principal component and additives such as conventionally used hardening agents (e.g., phenol novolak), silica, carbon and fillers.

EFFECT OF THE INVENTION

The adhesive sheet for wafer of the present invention is used in preparing a semiconductor device having such a structure that the back surfaces of the chips are partially or wholly in contact with a molding resin, typically a LOC structure. In the use of the adhesive sheet, a wafer which has been subjected to wafer processing is adhered onto the adhesive sheet, and the wafer is diced into chips. Using the chips, a semiconductor device having the above-mentioned structure is manufactured. The semiconductor device manufactured according to the process of the present invention is free from occurrence of package cracks, and hence the reliability of the manufactured article can be enhanced.

EXAMPLE

The present invention is illustrated below with reference to examples, but it should be construed that the invention is in no way limited to those examples.

In the following examples and comparative examples, "elastic modulus" and "rate of package crack occurrence" are evaluated as follows.

Elastic Modulus

An adhesive small specimen having a length of 50 mm, a width of 4 mm and a thickness of 0.2 mm is prepared from a radiation curable adhesive. The specimen is placed under a high-pressure mercury lamp of 80 W/cm and irradiated with radiation for 1 second to cure it. After curing, the specimen is measured on the elastic modulus at 3.5 Hz by means of a viscoelasticity measuring device (Rheovibron DDV-II-EP, produced by Orientic K.K.) to obtain a graph of elastic modulus, and from the graph a value at 25° C. is sought as the elastic modulus of the adhesive.

Rate of Package Crack Occurrence

After dicing, wafer chips are picked up from an adhesive sheet which has been irradiated with radiation. The chips are mounted on a lead frame, then subjected to bonding, and sealed with a molding resin (ortho-cresol type epoxy resin) under a high pressure. Then, the molding resin is thermally set at 175° C. over 5 hours to prepare a package containing the chips. The package is then allowed to stand for 504 hours in an atmosphere of 85° C. and 85% RH. Thereafter, the package is subjected to IR reflowing (time required: 1 minute) three times, and the sealed resin is inspected on the crack occurrence by means of scanning acomostic tomography (SAT). The percentage of the number of packages having cracks to the number of all packages tested is determined as a rate of package crack occurrence.

Example 1
[Preparation of a Radiation Curable Adhesive]

100 parts by weight of an acrylic adhesive (copolymer of hydroxyethyl acrylate and butyl acrylate, content of hydroxyethyl acrylate: 9% by weight (9.8% by mol), 70 parts by weight of a 2-functional urethane acrylate oligomer having a molecular weight of about 6,000 (available from Dainichiseika Color & Chemicals Co., Ltd.), 30 parts by weight of a 4-functional polyester oligomer and 10 parts by weight of an aromatic isocyanate (available from Toyo Ink Co., Ltd.) were mixed to prepare a radiation curable adhesive.

The radiation curable adhesive was measured on the elastic modulus. The result is set forth in Table 1.

[Preparation of an Adhesive Sheet for Wafer]

On a polyethylene film having a thickness of 100 μm, the above-prepared radiation curable adhesive was applied in an amount of 10 g/m$^2$ to form a radiation curable adhesive layer. On the radiation curable adhesive layer, a PET film of 38 μm in thickness which had been treated with silicone was laminated as a release sheet, to prepare an adhesive sheet for wafer.

[Preparation of a Semiconductor Device of LOC Structure]

Onto the adhesive sheet for wafer obtained above, which was fixed by a flat frame, a 6-inch silicon wafer containing test chips was adhered, and the wafer was diced into chips having a size of 12.2 mm×21.3 mm. Using the chips, a semiconductor device of LOC sealed structure was prepared. The semiconductor device was measured on the rate of package crack occurrence. The result is set forth in Table 1.

Example 2

The procedure of Example 1 was repeated except for using 30 parts by weight of a 6-functional polyester acrylate oligomer (available from Nippon Kayaku Co., Ltd.) instead of 30 parts by weight of the 4-functional polyester 5 oligomer. The results are set forth in Table 1.

Example 3

The procedure of Example 1 was repeated except for using an acrylic adhesive (copolymer of hydroxyethyl acrylate and butyl acrylate, content of hydroxyethyl acrylate 25 weight % (26.9% by mol)) instead of the acrylic adhesive used in Example 1.

The results are set forth in Table 1.

Example 4
[Preparation of a Radiation Curable Adhesive]

100 parts by weight of an acrylic adhesive (copolymer of hydroxyethyl acrylate and butyl acrylate, content of hydroxyethyl acrylate: 25% by weight (26.9% by mol), 70 parts by weight of a 2-functional urethane acrylate oligomer having a molecular weight of about 6,000 (available from Dainichiseika Color & Chemicals Co., Ltd.), 30 parts by weight of a 6-functional polyester oligomer (available from Nippon Kayaku Co., Ltd.) and 10 parts by weight of an aromatic isocryanate (available from Toyo Ink Co., Ltd.) were mixed to prepare a radiation curable adhesive.

The radiation curable adhesive was measured on the elastic modulus. The result is set forth in Table 1.

Then, the procedure of Example 1 was repeated except for using the radiation curable adhesive instead of the radiation curable adhesive used in Example 1.

The result is set forth in Table 1.

Comparative Example 1

The procedure of Example 1 was repeated except for using a copolymer of acrylic acid and butyl acrylate (content of acrylic acid: 9% by weight) as an acrylic adhesive in an amount of 100 parts by weight. The results are set forth in Table 1.

Comparative Example 2

The procedure of Example 1 was repeated except for varying the amount of the 2-functional urethane acrylate oligomer to 100 parts by weight and using no 4-functional polyester oligomer. The results are set forth in Table 1.

TABLE 1

|  | Elastic Modulus | Rate of Package Crack Occurrence |
| --- | --- | --- |
| Example 1 | $3.8 \times 10^9$ | 0% |
| Example 2 | $6.3 \times 10^9$ | 0% |
| Example 3 | $4.0 \times 10^9$ | 0% |
| Example 4 | $6.5 \times 10^9$ | 0% |
| Comp. Ex. 1 | $5.6 \times 10^9$ | 4% |
| Comp. Ex. 2 | $8.7 \times 10^7$ | 67% |

What is claimed is:

1. A process for preparing a semiconductor wafer for subsequent dicing into a plurality of semiconductor chips, said process comprising:

forming a radiation curable adhesive layer on a substrate film to provide a composite adhesive sheet, wherein the radiation curable adhesive layer includes
an acrylic adhesive material made of a copolymer of an acrylic ester and an OH group-containing polymerizable monomer existing in a quantity of 100 parts by weight, and
a radiation polymerizable compound having two or more unsaturated bonds in a quantity of 50–200 parts by weight;

securing the composite adhesive sheet to the back surface of a semiconductor wafer having respective circuits formed on the front surface thereof by pressing the radiation curable adhesive layer of the composite adhesive sheet onto the back surface of the semiconductor wafer;

dicing the semiconductor wafer into a plurality of semiconductor chips each containing a circuit on the front side thereof while retaining the plurality of semiconductor chips on the composite adhesive sheet;

irradiating the radiation curable adhesive layer of the composite adhesive sheet with radiation to cure the radiation curable adhesive layer such that the radiation polymerizable compound has an elastic modulus of not less than $1 \times 10^9$ dyne/cm$^2$ after curing;

removing the plurality of semiconductor chips from the composite adhesive sheet after the adhesive layer thereof has been cured by irradiation;

mounting the individual semiconductor chips on a lead frame; and packaging the individual chips with the back surfaces thereof in at least partial contact with a molding resin.

2. A process as set forth in claim 1, wherein 20 to 80% by weight of the radiation polymerizable compound having two or more unsaturated bonds as included in the radiation curable adhesive layer of said composite adhesive sheet are compounds having four or more unsaturated bonds.

3. A process as set forth in claim 1, wherein the acrylic adhesive material included in the radiation curable adhesive layer is a copolymer of hydroxyethyl acrylate and butyl acrylate.

4. A process as set forth in claim 3, wherein the hydroxyethyl acrylate included in the acrylic adhesive material is present in an amount of 9% by weight.

5. A process as set forth in claim 3, wherein the hydroxyethyl acrylate included in the acrylic adhesive material is present in an amount of 25% by weight.

6. A process as set forth in claim 3, wherein the radiation polymerizable compound included in the radiation curable adhesive layer includes 70 parts by weight of a 2-functional urethane acrylate oligomer having a molecular weight of the order of 6000, 30 parts by weight of a 4-functional polyester oligomer, and 10 parts by weight of an aromatic isocyanate.

7. A process as set forth in claim 3, wherein the radiation polymerizable compound included in the radiation curable adhesive layer includes 70 parts by weight of a 2-functional urethane acrylate oligomer having a molecular weight of the order of 6000, 30 parts by weight of a 6-functional polyester acrylate oligomer, and 10 parts by weight of an aromatic isocyanate.

8. A process as set forth in claim 1, further including, prior to the removal of the plurality of semiconductor chips from the composite adhesive sheet, the step of expanding the composite adhesive sheet to increase the distance between adjacent semiconductor chips for facilitating the removal of the semiconductor chips from the composite adhesive sheet.

9. A process as set forth in claim 1, wherein the elastic modulus of the radiation polymerizable compound included in the radiation curable adhesive layer after curing by irradiation is in a range of $1 \times 10^9$–$1 \times 10^{10}$ dyne/cm$^2$.

10. A process as set forth in claim 1, wherein the forming of a radiation curable adhesive layer on a substrate film further includes adding a radiation color developable compound into the radiation curable adhesive layer; and imparting color to the composite adhesive sheet in response to the irradiation of the radiation curable adhesive layer of the composite adhesive sheet with radiation.

11. A process as set forth in claim 10, wherein the radiation color developable compound included in the radiation curable adhesive layer is leuco dye which is essentially colorless prior to irradiation, but develops color in response to irradiation.

12. A process as set forth in claim 1, wherein the forming of a radiation curable adhesive layer on a substrate film further includes adding a light scattering compound to the radiation curable adhesive layer having the character of facilitating a decrease in the adhesion force of the composite adhesive sheet with respect to the back surfaces of the individual semiconductor chips in response to the irradiation of the radiation curable adhesive layer by a radiation source taken from the group consisting of ultraviolet light and an electron beam.

13. A process as set forth in claim 12, wherein the light scattering compound included in the radiation curable adhesive layer of the composite adhesive sheet is taken from the group consisting of silica powder, alumina powder, silica alumina powder, and mica powder.

* * * * *

UNITED STATES PATENT AND TRADEMARK OFFICE
CERTIFICATE OF CORRECTION

PATENT NO. : 6,297,076 B1
DATED : October 2, 2001
INVENTOR(S) : Masazumi Amagai et al.

It is certified that error appears in the above-identified patent and that said Letters Patent is hereby corrected as shown below:

Column 5,
Line 66, " "(Rheovibron " should read -- ("Rheovibron --.

Column 13,
Line 35, after "force" delete -- . --.

Signed and Sealed this

Fourth Day of June, 2002

Attest:

Attesting Officer

JAMES E. ROGAN
Director of the United States Patent and Trademark Office